(12) United States Patent
Chang et al.

(10) Patent No.: US 8,507,934 B2
(45) Date of Patent: Aug. 13, 2013

(54) LIGHT EMITTING DIODE PACKAGE AND METHOD FOR MANUFACTURING THE SAME

(75) Inventors: Chao-Hsiung Chang, Hsinchu (TW); Chieh-Ling Chang, Hsinchu (TW); Pi-Chiang Hu, Hsinchu (TW)

(73) Assignee: Advanced Optoelectronics Technology, Inc., Hsinchu Hsien (TW)

( * ) Notice: Subject to any disclaimer, the term of this patent is extended or adjusted under 35 U.S.C. 154(b) by 141 days.

(21) Appl. No.: 13/209,448

(22) Filed: Aug. 15, 2011

(65) Prior Publication Data

US 2012/0126264 A1    May 24, 2012

(30) Foreign Application Priority Data

Nov. 19, 2010 (CN) .......................... 2010 1 0550947

(51) Int. Cl.
*H01L 33/00* (2010.01)
(52) U.S. Cl.
USPC .............. 257/98; 257/E33.063; 257/E33.068; 438/29

(58) Field of Classification Search
USPC .............. 257/98, E33.063, E33.068; 438/29
See application file for complete search history.

(56) References Cited

U.S. PATENT DOCUMENTS

| | | | |
|---|---|---|---|
| 7,948,076 B2 * | 5/2011 | Wang et al. ............ | 257/707 |
| 2009/0146155 A1 * | 6/2009 | Wang et al. ............ | 257/82 |
| 2010/0006887 A1 * | 1/2010 | Takei et al. ............ | 257/100 |
| 2011/0260197 A1 * | 10/2011 | Kim ............ | 257/98 |
| 2012/0091493 A1 * | 4/2012 | Lin et al. ............ | 257/98 |
| 2012/0175660 A1 * | 7/2012 | Namiki et al. ............ | 257/98 |

* cited by examiner

*Primary Examiner* — Victor A Mandala
(74) *Attorney, Agent, or Firm* — Altis Law Group, Inc.

(57) ABSTRACT

An exemplary light emitting diode (LED) package includes a substrate having a first electrical portion and a second electrical portion formed thereon, two antioxidation layers formed on and electrically connected to the first electrical portion and the second electrical portion, respectively, and an LED chip disposed on the substrate and electrically connected to the two antioxidation layers.

18 Claims, 8 Drawing Sheets

LIGHT EMITTING DIODE PACKAGE AND METHOD FOR MANUFACTURING THE SAME

TECHNICAL FIELD

The disclosure relates generally to light emitting devices, and more particularly to a light emitting diode package and a method for manufacturing the same.

DESCRIPTION OF THE RELATED ART

In recent years, light emitting diodes (LEDs) have become more and more popular, due to their low power-consumption, energy saving properties, high efficiency, short reactive time, long life. Moreover, LEDs contain no mercury. Generally, an LED includes a substrate having electrical portions formed thereon, and an LED chip mounted on the substrate and electrically connected to the electrical portions. However, the electrical portions are made of metallic materials which are usually prone to be oxidized. An oxidization of the electrical portions may result in a malfunction of the LED package.

Therefore, it is desirable to provide a light emitting diode package which can overcome the described limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the present light emitting diode package for microminiaturization. Moreover, in the drawings, like reference numerals designate corresponding parts throughout the whole views.

DETAILED DESCRIPTION

Reference will now be made to the drawings to describe the exemplary embodiments in detail.

Figure 1:
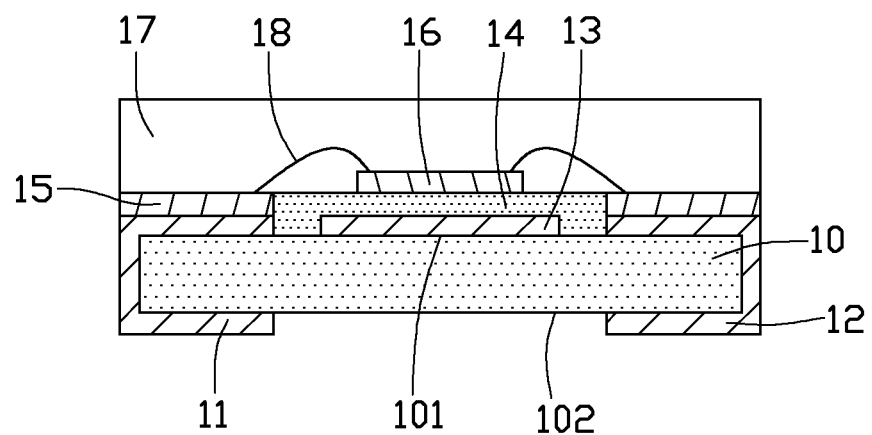
FIG. 1 is a schematic, cross-sectional view of an LED package according to an exemplary embodiment of the present disclosure.

Referring to FIG. 1, an LED package in accordance with an exemplary embodiment of the present disclosure is illustrated. The LED package comprises a substrate 10, a first electrical portion 11 formed on a lateral side of the substrate 10, a second electrical portion 12 formed on an opposite lateral side of the substrate 10, a reflecting layer 13 formed on the substrate 10 between the first and second electrical portions 11, 12, an insulating block 14 covering the reflecting layer 13, two antioxidation layers 15 respectively formed on the first and second electrical portions 11, 12, an LED chip 16 mounted on the insulating block 14, and an encapsulant 17 covering the LED chip 16. The LED chip 16 is electrically connected to the first and second electrical portions 11, 12 respectively via two wires 18.

The substrate 10 is made of $Al_2O_3$, silicon, SiC, ceramic, polymer, or electrically insulting quartz. The substrate 10 has a top face 101 and a bottom face 102 opposite to the top face 101. The first electrical portion 11 and the second electrical portion 12 both extend from the top face 101 to the bottom face 102 of the substrate 10 along an outer edge of the substrate 10, whereby the LED package is formed as a surface mounting type device. The first electrical portion 11 is spaced from the second electrical portion 12.

Figure 2:
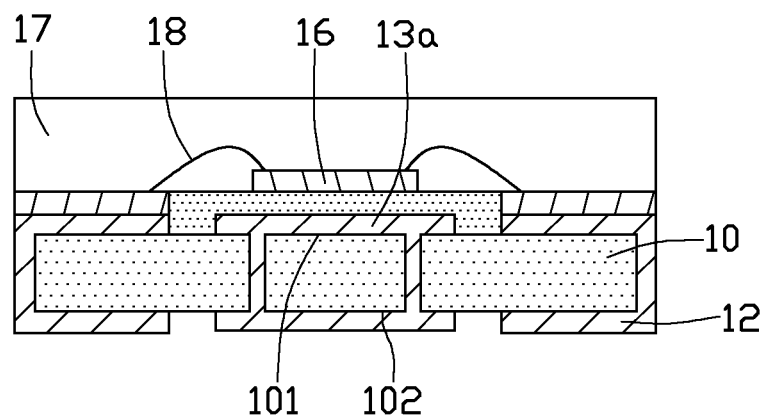
FIG. 2 is a schematic, cross-sectional view of an LED package according to an alternative embodiment of the present disclosure.

The reflecting layer 13 is formed on the top face 101 of the substrate 10 and is located between the first electrical portion 11 and the second electrical portion 12. The reflecting layer 13 is spaced from the first and second electrical portions 11, 12. The reflecting layer 13 is made of metal, such as silver, nickel, or alloy thereof. Alternatively, the reflecting layer 13a can further extend to the bottom face 102 of the substrate 10, as shown in FIG. 2.

The insulating block 14 cooperates with the substrate 10 to enclose the reflecting layer 13 therein. The insulating block 14 is made of electrically insulting and transparent material, such as silicone or $SiO_2$.

Figure 3:
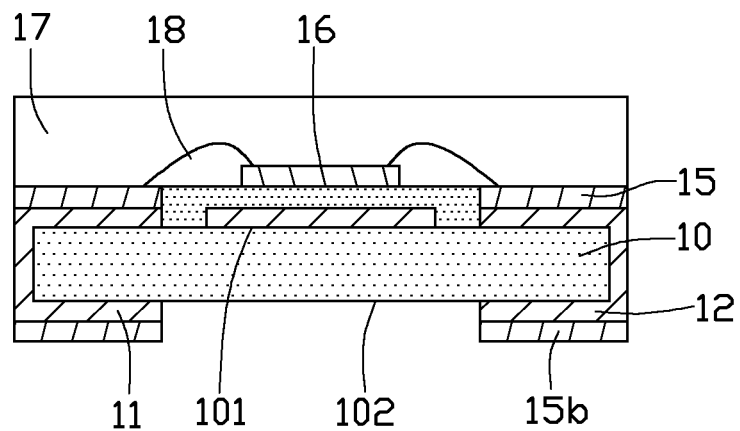
FIG. 3 is a schematic, cross-sectional view of an LED package according to an another alternative embodiment of the present disclosure.

The antioxidation layer 15 is formed by electroplating. The antioxidation layer 15 is made of noble metal which is highly resistant to oxidation and corrosion, such as Au (gold), Pt (platinum), or Ag (silver). In the exemplary embodiment of the disclosure, the antioxidation layers 15 are formed on top portions of the first and second electrical portions 11, 12. A top face of the insulating block 14 is coplanar with top faces of the antioxidation layers 15. It can be understood that, in an another alternative embodiment of the disclosure, another antioxidation layers 15b are formed on bottom portions of the first and second electrical portions 11, 12, as shown in FIG. 3. The antioxidation layers 15 are electrically attached on the first and second electrical portions 11, 12, respectively. The LED chip 16 is electrically connected to the two antioxidation layers 15 respectively via the two wires 18.

The encapsulant 17 is made of transparent materials, such as silicone, epoxy, quartz, or glass. The encapsulant 17 further comprises phosphors mixed therein, such as YAG, TAG, silicate, nitride, nitrogen oxides, phosphide, arsenide, telluride or sulfide. The phosphors are used for changing color of light from the LED chip 16 into a different color.

Referring to FIGS. 4-8, the disclosure provides a method for manufacturing the light emitting diode package in accordance with the exemplary embodiment of the disclosure.

Figure 4:
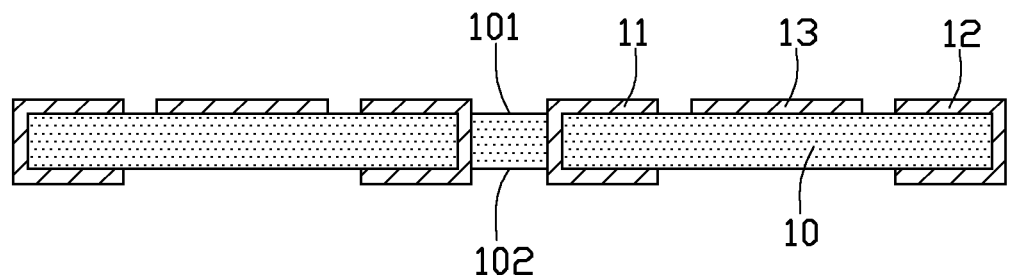
FIGS. 4 to 8 show first to fifth steps of a method for manufacturing the LED package of FIG. 1, respectively.

Firstly, a substrate 10 is provided as shown in FIG. 4. The substrate 10 has a top face 101 and a bottom face 102. At least a first electrical portion 11 and a second electrical portion 12 are formed on the substrate 10. The first electrical portion 11 and the second electrical portion 12 extend from the top face 101 to the bottom face 102 of the substrate 10 along an outer edge of the substrate 10. A reflecting layer 13 is formed on the top face 101 of the substrate 10 between the first and second electrical portions 11, 12.

Figure 5:
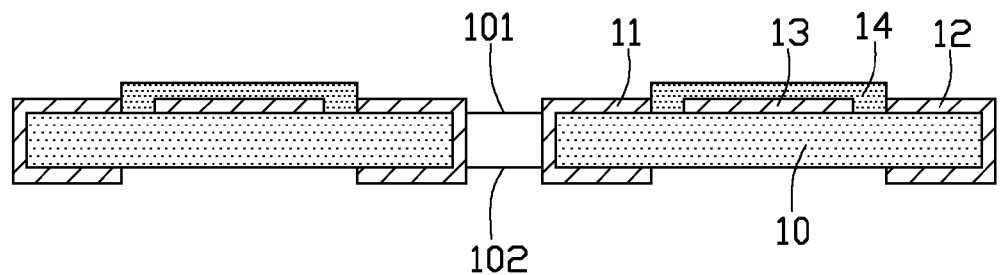

Then, as shown in FIG. 5, an insulating block 14 is provided to cover the reflecting layer 13. The insulating block 14 cooperates with the substrate 10 to enclose the reflecting layer 13 therein.

Figure 6:
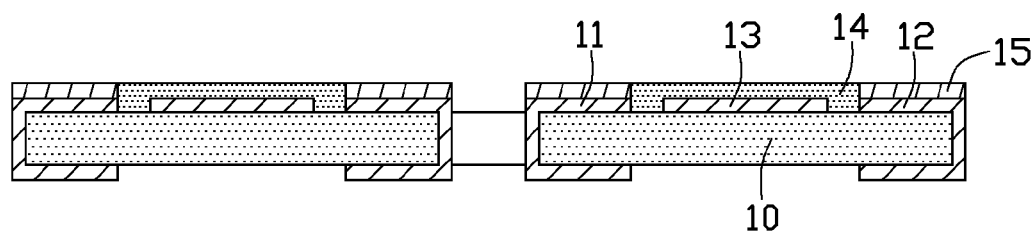

Then, as shown in FIG. 6, two antioxidation layers 15 are formed on the first electrical portion 11 and the second electrical portion 12, respectively, by electroplating.

Figure 7:
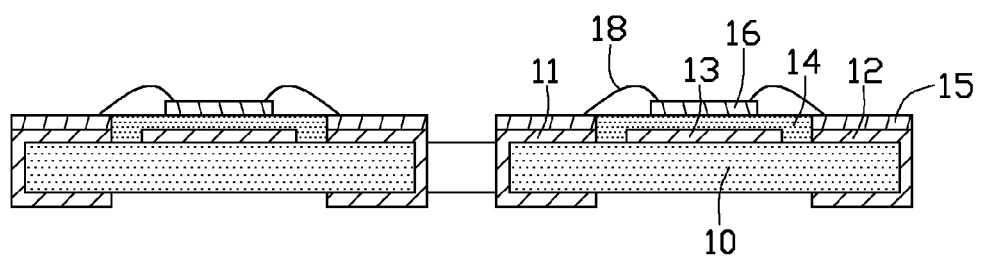

Then, as shown in FIG. 7, at least an LED chip 16 is disposed on the insulating block 14. The LED chip 16 is electrically connected to the two antioxidation layers 15 respectively via two wires 18.

Figure 8:
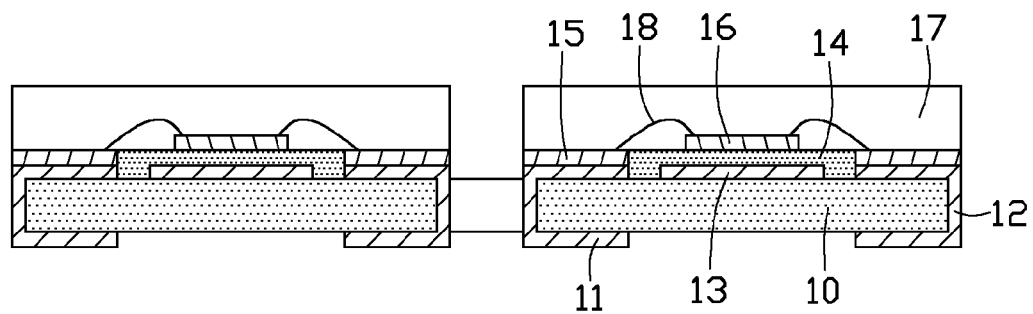

Then, as shown in FIG. 8, an encapsulant 17 is formed on the LED chip 16. The encapsulant 17 is made of transparent materials, such as silicone, epoxy, quartz, or glass. The encapsulant 17 can have phosphors doped therein.

It is to be understood, however, that even though multiple characteristics and advantages of the disclosure have been set forth in the foregoing description, together with details of the structure and function of the invention disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A light emitting diode (LED) package, comprising:
a substrate having a first electrical portion and a second electrical portion formed thereon;
two antioxidation layers formed on and electrically connected to the first electrical portion and the second electrical portion, respectively;
an LED chip disposed on the substrate and electrically connected to the two antioxidation layers;
a reflecting layer formed on the substrate between the two antioxidation layers; and
an insulating block covering the reflecting layer, wherein the insulating block cooperates with the substrate to enclose the reflecting layer therein.

2. The LED package of claim 1, wherein the antioxidation layers are made of noble metal.

3. The LED package of claim 1, wherein the LED chip is mounted on the insulating block.

4. The LED package of claim 1, wherein a top face of the insulating block is coplanar with top faces of the antioxidation layers.

5. The LED package of claim 1, wherein the reflecting layer extends from a top face of the substrate to a bottom face of the substrate.

6. The LED package of claim 1, wherein the first electrical portion and the second electrical portion extend from a top face of the substrate to a bottom face of the substrate.

7. The LED package of claim 6, wherein the two antioxidation layers formed on top portions of the first electrical portion and the second electrical portion, respectively.

8. The LED package of claim 7, further comprising another two antioxidation layers formed on bottom portions of the first electrical portion and the second electrical portion, respectively.

9. The LED package of claim 1, further comprising an encapsulant covering the LED chip.

10. A method for manufacturing a light emitting diode (LED) package comprising following steps:
providing a substrate having a first electrical portion and a second electrical portion formed thereon;
forming a reflecting layer on the substrate;
providing an insulating block covering the reflecting layer;
forming two antioxidation layers on the first electrical portion and the second electrical portion, respectively; and
providing an LED chip mounted on the insulating block and electrically connected to the first electrical portion and the second electrical portion;
wherein a top face of the insulating block is coplanar with top faces of the antioxidation layers.

11. The method of claim 10, wherein the antioxidation layers are made of metal which is resistant to oxidization and corrosion.

12. The method of claim 10, wherein the reflecting layer is attached on a top face of the substrate.

13. The method of claim 10, wherein the first electrical portion and the second electrical portion extend from a top face of the substrate to a bottom face of the substrate.

14. The method of claim 13, wherein the two antioxidation layers formed on top portions of the first electrical portion and the second electrical portion, respectively.

15. The method of claim 10, further comprising providing an encapsulant covering the LED chip.

16. The method of claim 10, wherein the insulating block cooperates with the substrate to enclose the reflecting layer therein.

17. The method of claim 10, wherein the antioxidation layers are formed by electroplating.

18. A method for manufacturing a light emitting diode (LED) package comprising following steps:
providing a substrate having a first electrical portion and a second electrical portion formed thereon;
forming a reflecting layer on the substrate;
providing an insulating block covering the reflecting layer;
forming two antioxidation layers on the first electrical portion and the second electrical portion, respectively; and
providing an LED chip mounted on the insulating block and electrically connected to the first electrical portion and the second electrical portion;
wherein the insulating block cooperates with the substrate to enclose the reflecting layer therein.

* * * * *